United States Patent [19]
Katakura

[11] Patent Number: 5,972,794
[45] Date of Patent: Oct. 26, 1999

[54] SILICON STENCIL MASK MANUFACTURING METHOD

[75] Inventor: Norihiro Katakura, Kawasaki, Japan

[73] Assignee: Nikon Corporation, Tokyo, Japan

[21] Appl. No.: 09/044,383

[22] Filed: Mar. 18, 1998

[51] Int. Cl.⁶ .................................................. H01L 21/027
[52] U.S. Cl. .......................... 438/704; 438/705; 438/710; 438/734; 430/5; 216/2; 216/12
[58] Field of Search ................................. 438/696, 704, 438/705, 710, 719, 734, 753; 430/5; 216/2, 12

[56] References Cited

U.S. PATENT DOCUMENTS 5,756,237  5/1998  Amemiya ..................................... 430/5

Primary Examiner—Benjamin Utech
Assistant Examiner—Donald L. Champagne
Attorney, Agent, or Firm—Klarquist Sparkman Campbell Leigh & Whinston, LLP

[57] ABSTRACT

Methods are disclosed for manufacturing silicon stencil masks for use in charged-particle-beam microlithography. According to the method, a boron-doped layer is formed on a silicon substrate, a mask pattern is formed on the boron doped layer, and the boron-doped layer is etched according to the mask pattern to form voids in the boron-doped layer. The voids do not extend completely through the thickness of the boron-doped layer. In subsequent steps, a silicon nitride layer is applied and etched to form openings in which the silicon substrate is etched away to form struts. Because the boron-doped layer is not completely etched through in the earlier etching step, the mask is much more resistant to fracture in a subsequent cleaning step. In a final step after cleaning, the boron-doped layer is etched to extend the voids completely through the thickness of the boron-doped layer.

2 Claims, 3 Drawing Sheets

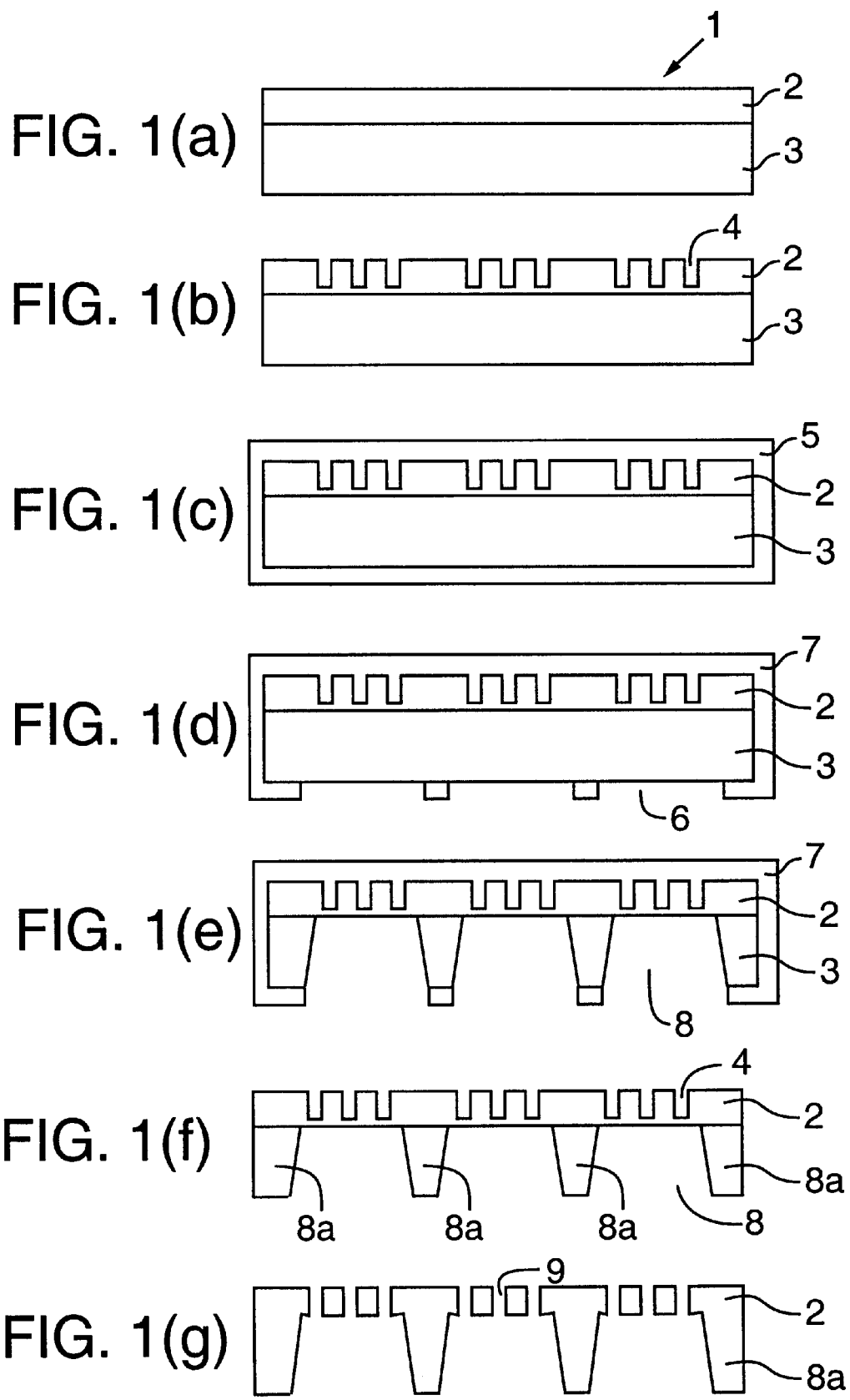

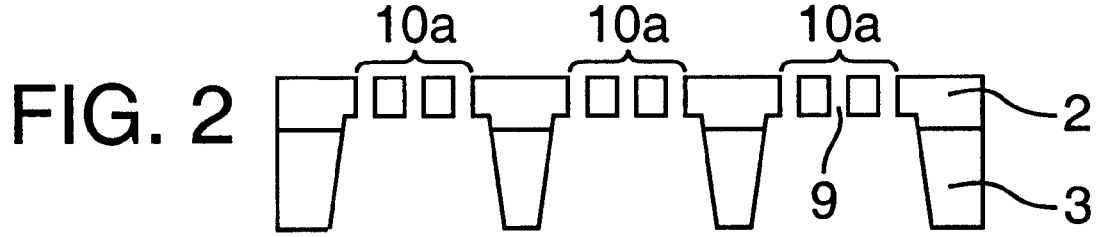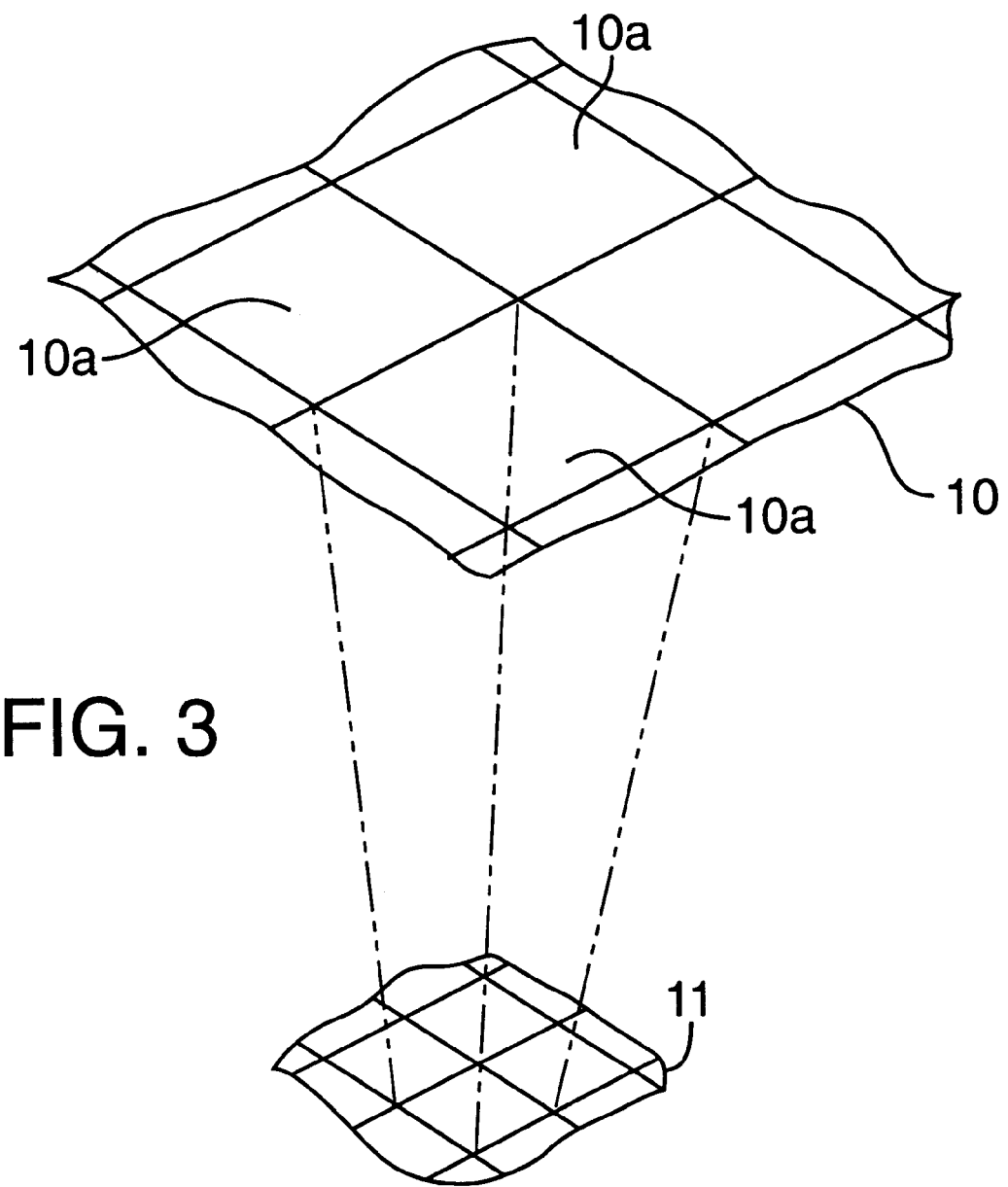

SILICON STENCIL MASK MANUFACTURING METHOD

FIELD OF THE INVENTION

This invention pertains to methods for manufacturing silicon stencil masks.

BACKGROUND OF THE INVENTION

In recent years, increased integration of integrated circuits has posed the need to use microlithography processes capable of resolving smaller feature sizes. In view of the perceived resolution limits of optical microlithography, microlithographic apparatus and methods employing a charged-particle beam (e.g., electron beam or ion beam) have been the subject of intense development efforts. Considerable effort has also been expended to develop a practical X-ray microlithography system.

In electron-beam microlithography, it has been possible to form and use an electron beam tightly focused to several nanometers in diameter for "drawing" minute patterns having feature sizes of 1 $\mu$m or less. During such drawing, the beam is scanned so as to trace the entire exposure pattern. As a result, a substantial amount of time is required to complete an exposure of an entire die on a sensitive substrate (e.g., a wafer) Thus, using an electron beam to "draw" features on a sensitive substrate has a much lower throughput than, e.g., projection microlithography. Also, if the pattern to be drawn comprises extremely small features, the diameter of the charged particle beam must be correspondingly smaller, which poses certain technical challenges.

Projection microlithography, including such microlithography employing a charged-particle beam, utilizes a mask or reticle ("mask") that defines the pattern to be transferred to a sensitive substrate. Because of certain limitations in simultaneously projecting the entire mask pattern using a charged particle beam, the mask field is typically divided into multiple "subfields" each defining a portion of the overall pattern. The subfields are normally all the same size and are separated from each other on the mask by struts that serve principally to provide mechanical rigidity to the mask. The subfields are scanned subfield-by-subfield and projected individually through a charged-particle-beam optical system onto corresponding "transfer subfields" on the substrate. The transfer subfields are projected onto the substrate in such a manner that regions of the mask occupied by the struts are not included in the exposure on the substrate; i.e., the transfer subfields are "stitched" together without struts to form a complete die.

For use with a charged-particle beam, one group of masks is termed "stencil masks", in which pattern regions through which the beam is intended to readily pass are defined as voids. A representative method known in the art for manufacturing a stencil mask is depicted stepwise in FIGS. 4(a)–4(f).

In a first step (FIG. 4(a)), a surface of a silicon substrate is doped with boron using, typically, thermal diffusion. Such doping forms a surficially doped silicon substrate 12 comprising boron-doped layer 13 and a silicon substratum 14.

In a second step (FIG. 4(b)), an electron beam is used to form a desired resist pattern on the surface of the boron-doped layer 13, which is subsequently etched to form corresponding voids 15 extending through the thickness of the boron-doped layer 13 to the substratum 14. The pattern-defining voids 15 are located in regions that are destined to be mask subfields.

In a third step (FIG. 4(c)), a silicon nitride layer 16 is applied to all surfaces, typically using a low-pressure chemical vapor deposition (LPCVD) technique. A pattern of openings 17 is then formed on the lower silicon nitride layer, wherein each such opening 17 corresponds to a respective future location of a mask subfield and is thus situated opposite a respective group of voids 15 destined to be within a respective mask subfield (FIG. 4(d)).

With the silicon nitride layer serving as a mask 18, the structure shown in FIG. 4(d) is immersed in an aqueous KOH solution that "wet etches" the silicon substratum 14 at each exposed location 17 (FIG. 4 (e)). Wet etching is allowed to progress depthwise through the substratum 14 to the boron-doped layer 13 to form voids 19 extending depthwise entirely through the thickness of the silicon substratum 14.

After the wet etching step, the structure shown in FIG. 4(e) is removed from the KOH solution and washed using a solution comprising nitric acid and hydrogen peroxide, rinsed with pure water, and allowed to dry. The silicon nitride layer 16 is then removed by a dry etching technique to complete formation of the stencil mask 20 (FIG. 4(f)). The stencil mask comprises struts 21 separating the subfields 22 from each other.

Unfortunately, when the nearly finished mask is removed from the aqueous KOH solution after completion of the wet etching step, surface tension commonly causes fracture of the mask, resulting in low manufacturing efficiency.

SUMMARY OF THE INVENTION

In view of the foregoing, an object of the invention is to provide methods for making silicon stencil masks that do not pose high risks of fracture before completion of manufacturing.

According to one aspect of the invention, a preferred embodiment of the subject method comprises various steps as follows. In a first step, a boron-doped layer is formed on a silicon substrate. A mask pattern is formed on the boron-doped layer. The boron-doped layer is then etched to form corresponding voids in the boron-doped layer. The voids do not extend completely through the thickness dimension of the boron-doped layer. A silicon nitride layer is then formed over the surface of the structure formed in the previous step. On a surface of the silicon substrate located opposite the boron-doped layer, openings are formed in the silicon nitride layer to expose the silicon substrate in regions corresponding to intended subfields of the mask. Then, using the silicon nitride layer as a mask, the silicon substrate is wet etched through its thickness dimension to the boron-doped layer so as to form struts from the residual silicon. The silicon nitride layer is removed, and the boron-doped layer is dry-etched to extend the voids in the boron-doped layer completely through the thickness dimension of the boron-doped layer.

During the initial etching of the boron-doped layer, the preferred etching technique is either very-low-temperature plasma dry etching or sidewall-protected plasma dry etching.

According to another aspect of the invention, silicon stencil masks produced by the subject method are provided.

The foregoing and additional features and advantages of the invention will be more readily understood with reference to the following detailed description that proceeds with reference to the accompanying drawings.

BRIEF DESCRIPTION OF THE DRAWINGS

FIGS. 1(a)–1(g) depict the results of certain steps in a preferred embodiment of a method according to the present invention for manufacturing a silicon stencil mask.

FIG. 2 is a schematic vertical section through a representative silicon stencil mask.

FIG. 3 depicts general principles of partitioned exposure using the silicon stencil mask.

DETAILED DESCRIPTION

Figure 4A:
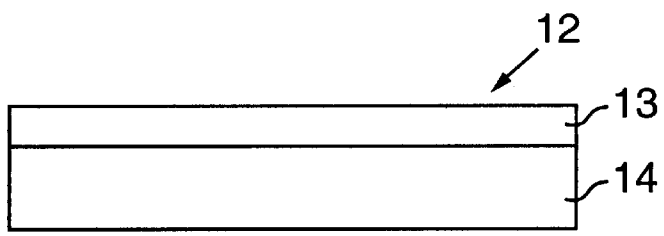
FIGS. 4(a)–4(e) depict the results of certain steps in a conventional method for manufacturing a silicon stencil mask.
Figure 4B:
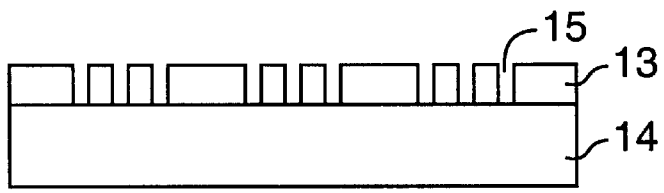
Figure 4C:
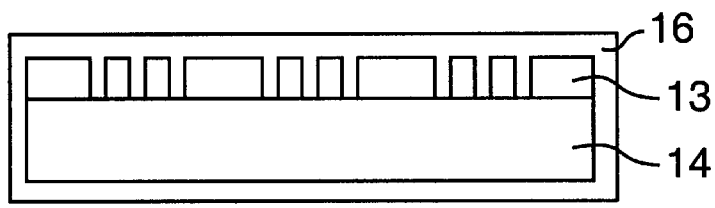
Figure 4D:
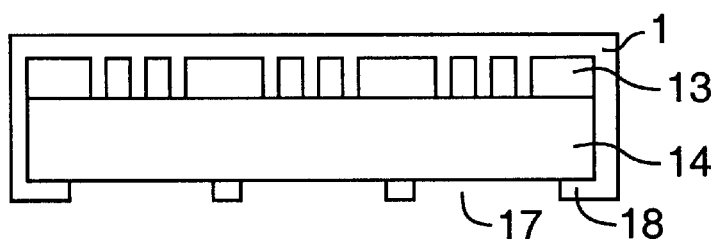
Figure 4E:
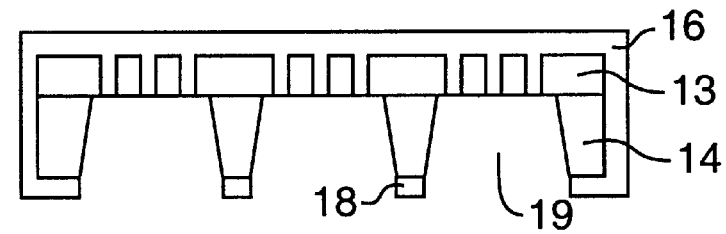
Figure 4F:
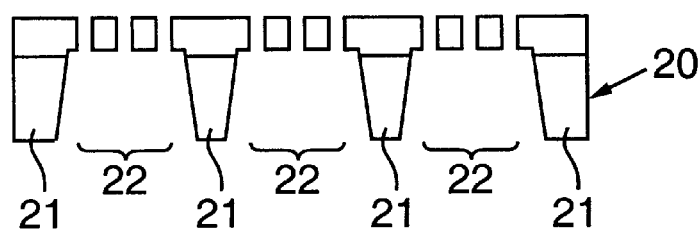

A preferred embodiment of a method according to the invention is described below with reference to FIGS. 1(a)–1(g) and 2–3.

Turning first to FIG. 2, a typical silicon stencil mask manufacturable by the present methods comprises a boron-doped layer 2 that defines voids 9 extending therethrough. The mask is divided into multiple mask subfields 10a each typically (but not necessarily) of identical size. Each subfield 10a defines a respective portion of the overall mask pattern. The subfields 10a are delineated from each other by silicon struts 3 that, as can be appreciated from FIG. 2, provide the mask with structural rigidity.

The results of certain steps in a preferred embodiment of a method according to the invention are depicted in FIGS. 1(a)–1(g).

In a first step, a boron doped layer 2 is formed on the surface of a silicon substrate 3 to produce the structure 1 shown in FIG. 1(a). In a completed mask, if the boron-doped layer 2 is intended to scatter particles (e.g., electrons) in the charged-particle beam, the boron-doped layer 2 is preferably 1.5 to 2.5 µm thick. If the boron-doped layer 2 is intended to absorb particles, the boron-doped layer 2 preferably has a thickness of 20 to 30 µm.

The concentration of boron dopant in the boron-doped layer 2 progressively decreases with increasing depth in the thickness dimension of the layer. Preferably, the boron dopant concentration at a depth at which it serves to stop wet etching by aqueous KOH is approximately $1 \times 10^{20}$ atoms/cm$^3$.

In a next step (FIG. 1(b)), an electron beam is preferably used to form a desired resist pattern on the surface of the boron-doped layer 2. The boron-doped layer 2 is then anisotropically etched part way through its thickness dimension to form a corresponding pattern of channels 4 and other voids in the boron-doped layer 2.

Preferred techniques for performing anisotropic etching are plasma dry etching at extremely low temperature and sidewall-protected plasma dry etching. In the low-temperature plasma dry etching technique, the temperature of the substrate 3 is maintained at a very low temperature (preferably −110° C. to −120° C.) during actual etching which reduces any reaction of free radicals in the plasma on the sidewalls of the channels 4 during etching. Temperature control is important. If the temperature should be above −110° C., controlling undesired reactions of the free radicals is prohibitively difficult, and anisotropic etching cannot be reliably achieved.

The sidewall-passivation plasma dry etching technique utilizes a mixture of silicon-etching gases and sidewall-passivation gases to etch the boron doped layer. With a concentration of boron dopant in the boron-doped layer 2 of about $1 \times 10^{20}$ atoms/cm$^3$, the etching can be accomplished using a silicon-etching gas. The sidewall-passivation gases comprise polymers that protect the sidewalls of the channels 4 formed by etching, allowing the desired perpendicular etching of the channels 4. Representative mixtures of gases include $Cl_2+CHF_3$, $SF_6+C_3H_8$, and $SF_6+C_4H_8$, wherein $Cl_2$ and $SF_6$ are silicon-etching gases and $CHF_3$, $C_3H_8$, and $C_4F_8$ tend to polymerize under etching conditions to form a passivated layer on the channel sidewalls. The protective layers inhibit etching laterally into the sidewalls.

In a next step (FIG. 1(c)), a silicon nitride layer 5 is applied over all surfaces, preferably using a LPCVD technique.

In the next step (FIG. 1(d)), openings 6 are formed in the silicon nitride layer 5 on the surface opposite the surface comprising the channels 4. The location of the openings 6 correspond to intended locations of mask subfields.

In the next step (FIG. 1(e)), the FIG. 1(d) structure is immersed in an aqueous KOH solution. During immersion, the silicon nitride layer 7 serves as a protective etching mask, allowing etching to proceed into the exposed surfaces of the silicon substrate 3. Thus, the KOH etchant wet etches the silicon substrate depthwise to the boundary with the boron-doped layer 2, thereby forming channels 8 extending through the thickness of the silicon substrate 3. Protected regions of the silicon substrate 3 leave silicon struts 8a.

In step 1(e), the etching rate of the aqueous KOH decreases significantly whenever the concentration of boron in the boron-doped layer 2 is at least $1 \times 10^{20}$ atoms/cm$^3$, which is regarded as a "critical" concentration for stopping etching. So long as the boron-doped layer 2 has such a critical concentration of dopant at the interface between the layers 2 and 3, wet etching is effectively stopped at the interface.

After completion of wet etching, the etched structure is removed from the aqueous KOH solution and cleaned using a mixture of sulfuric acid and hydrogen peroxide, rinsed with pure water, and allowed to dry. The silicon nitride layer 7 is subsequently removed by a dry or wet etching technique (FIG. 1(f)).

In the last step (FIG. 1(g)), the boron-doped layer 2 in which the channels 4 were previously formed is etched further to extend the channels 4 completely through the thickness dimension of the boron-doped layer 2 to form the voids 9 of the completed stencil mask.

WORKING EXAMPLE

This working example is an application of the method of FIGS. 1(a)–1(g) to manufacturing a stencil mask as shown in FIG. 2. First, using thermal diffusion, boron was diffused depthwise into the surface of a silicon substrate 380 µm thick. The boron-doped layer 2 was 2.3 µm thick and had a boron dopant concentration of $1 \times 10^{20}$ atoms/cm$^3$. The resulting structure is depicted in FIG. 1(a).

In the next step, a desired resist pattern is formed on the surface of the boron-doped layer 2 using an electron beam. The substrate temperature was reduced to −120° C. and exposed to $SF_6$ at a pressure of 0.5 Pa to perform very-low-temperature plasma dry etching of the boron-doped layer. Such etching produced channels 4 extending 2 µm deep into the boron-doped layer 2 (FIG. 1(b)).

Using LPCVD, a 0.1-µm thick silicon nitride layer 5 was formed (FIG. 1(c)) on the entire surface of the FIG. 1(b) structure. Separate openings 6 were then formed on the opposite surface (FIG. 1(d)). Using the silicon nitride layer 7 as a mask covering all but the openings 6, the FIG. 1(d) structure was immersed in an aqueous KOH solution which wet-etched the exposed regions of the silicon substrate 3 (FIG. 1(e)).

After completion of wet etching, the FIG. 1(e) structure was removed from the KOH solution, cleaned with a mixture of sulfuric acid and hydrogen peroxide, rinsed with pure water, and allowed to dry. The remaining silicon nitride 7 was removed by dry etching (FIG. 1(f)).

Lastly, the boron-doped layer 2 was dry-etched further to allow the channels 4 to extend completely through the thickness of the boron-doped layer 2. Etching was performed in the same direction in which etching of the silicon substrate 3 progressed in the FIG. 1(d) step. During further dry-etching of the boron-doped layer 2, the silicon substrate was maintained at a temperature of −120° C. and exposed to $SF_6$ gas at a pressure of 10 Pa. Thus, the voids 9 were formed in the boron-doped layer 2 (FIG. 1(g)) to complete manufacture of the stencil mask.

A second mask was produced using alternative techniques to the etching techniques used in the steps of FIGS. 1(b) and 1(f). Specifically, the silicon substrate 3 was plasma dry-etched with sidewall protection, wherein the silicon substrate was maintained at room temperature and etched using $Cl_2+CHF_3$ as the reactive gas at a pressure of 0.5 Pa.

Thus, according to the invention, the structure that is subjected to etching in the aqueous KOH solution has only partially etched channels 4 in the boron-doped layer rather than through-voids 9. Consequently, during the wet-etching step (and subsequent cleaning and rinsing), the boron-doped layer has sufficient structural integrity to be resistant to fracture by surface tension.

Whereas the invention has been described in connection with a preferred and alternative embodiments, it will be understood that the invention is not limited to those embodiments. On the contrary, the invention is intended to encompass all modifications, alternatives, and equivalents as may be encompassed by the invention as defined by the appended claims.

What is claimed is:

1. A method for manufacturing a silicon stencil mask, comprising the steps:

(a) forming a boron-doped layer on a silicon substrate;

(b) forming a mask pattern on the boron-doped layer;

(c) etching the boron-doped layer according to the mask pattern to form corresponding voids in the boron-doped layer, the voids extending not entirely through the thickness dimension of the boron-doped layer;

(d) forming a silicon nitride layer on the surface of the structure formed in step (c);

(e) on a surface of the silicon substrate opposite the boron-doped layer, forming openings in the silicon nitride layer to expose the silicon substrate in regions corresponding to intended subfields of the mask;

(f) using the silicon nitride layer as a mask, wet etching through the thickness dimension of the silicon substrate to the boron-doped layer, to form struts from the residual silicon;

(g) removing the silicon nitride layer;

(h) dry-etching the boron-doped layer to extend the voids formed in step (c) completely through the thickness dimension of the boron-doped layer.

2. The method of claim 1, wherein, in step (c), the boron-doped layer is etched by very-low-temperature plasma dry etching or by sidewall-passivated plasma dry etching.

* * * * *

UNITED STATES PATENT AND TRADEMARK OFFICE
CERTIFICATE OF CORRECTION

PATENT NO. : 5,972,794

DATED : October 26, 1999

INVENTOR(S) : Norihiro Katakura

It is certified that error appears in the above-identified patent and that said Letters Patent is hereby corrected as shown below:

On the Cover Page:

The following foreign priority data should be added:

-- [30] Foreign Application Priority Data
      March 18, 1997 [JP]    Japan.................9-064491 --

Signed and Sealed this

Seventeenth Day of April, 2001

Attest:

NICHOLAS P. GODICI

*Attesting Officer*    *Acting Director of the United States Patent and Trademark Office*